(12) United States Patent
Ng et al.

(10) Patent No.: US 6,952,106 B1
(45) Date of Patent: Oct. 4, 2005

(54) E-BEAM VOLTAGE POTENTIAL CIRCUIT PERFORMANCE LIBRARY

(75) Inventors: William Ng, San Jose, CA (US); Kevin Weaver, San Jose, CA (US); Zachary Joshua Gemmill, Mountain View, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 10/681,544

(22) Filed: Oct. 8, 2003

(51) Int. Cl.[7] .......................................... G01R 31/307

(52) U.S. Cl. ..................................... 324/751; 324/765

(58) Field of Search ............................... 324/751, 765; 714/736, 737

(56) References Cited

U.S. PATENT DOCUMENTS

| | | | | |
|---|---|---|---|---|
| 6,091,249 A | * | 7/2000 | Talbot et al. | 324/751 |
| 6,326,798 B1 | * | 12/2001 | Kuribara | 324/751 |
| 6,344,750 B1 | * | 2/2002 | Lo et al. | 324/751 |
| 6,586,952 B2 | * | 7/2003 | Nozoe et al. | 324/751 |
| 6,642,726 B2 | * | 11/2003 | Weiner et al. | 324/751 |

* cited by examiner

*Primary Examiner*—Ernest Karlsen
(74) *Attorney, Agent, or Firm*—Stallman & Pollock LLP

(57) ABSTRACT

Point-by-point image contrast values are generated from secondary electron collection during unbiased electron or ion beam bombardment of an integrated circuit (IC) in a vacuum environment to quantify the physical and electrical integrity of connections within the device. These values are stored for each type of circuit cell under standard conditions to quantify and check the performance of individual cells on the device.

1 Claim, 4 Drawing Sheets

E-BEAM VOLTAGE POTENTIAL CIRCUIT PERFORMANCE LIBRARY

TECHNICAL FIELD

The present invention is directed to a cell library of image contrast values that can be correlated to and generated from a layout database.

DESCRIPTION OF THE INVENTION

The present invention utilizes a point-by-point image contrast value generated from secondary electron collection during unbiased electron or ion beam bombardment of an integrated circuit (IC) under analysis in a vacuum environment to quantify the physical and electrical integrity of connections within the individual circuit cells of the IC device. This information can be stored for each type of circuit cell under standardized conditions to quantify and check the performance of individual circuit cells on the device. Circuit cell libraries of these values can be created, stored and used as standards for the debug of new products. The values can eventually be automatically generated and a routine option associated with the circuit layout database file can be used as necessary. The generated image file can then be utilized as a reference to show what the circuit cell voltage contrast should be when compared to the actual circuit cell voltage contrast data image of a device under debug analysis once the design has been transferred onto silicon. This verification method can be used for faster debug of new designs and requires less design engineering time for the analysis.

Figure 1:
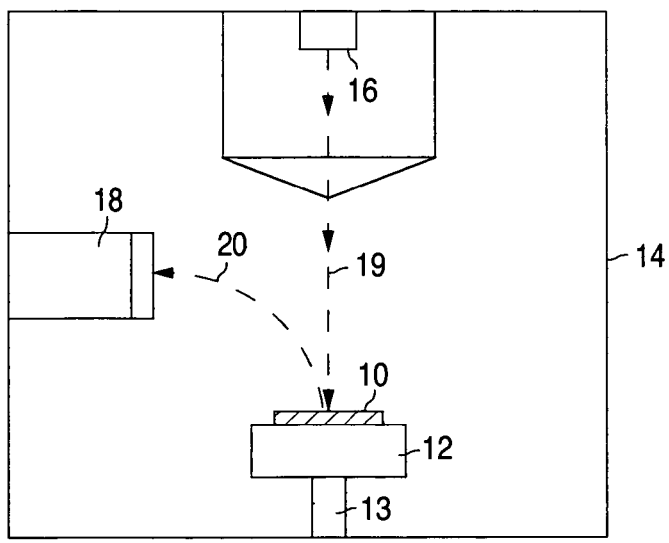
FIG. 1 shows a schematic representation of an SEM inspection apparatus that can be utilized in generating integrated circuit image contrast values in accordance with the concepts of the present invention.

As shown in FIG. 1, the IC sample under analysis 10 is placed on a grounded substrate mount 12 with circuitry facing up. It is then placed on an x,y stage 13 in a vacuum chamber 14 with and electron or ion bombardment source 16 and a secondary electron detector system 18, such as a scanning electron microscope, a focused ion beam system, or an e-beam probe system. The IC 10 is not biased with external power. Analysis conditions, such as bombardment energy, are standardized to optimize the image contrast for different processing technologies. Contrast images can be collected at all levels of circuit processing such as at poly, contact, metal1 (M1), dielectric1 (D1), metal2 (M2), etc. As a beam 19 from the electron/ion bombardment source 16 rasters across surface of the integrated circuit (IC) 10 during SEM (Scanning Electron Microscopy) inspection as shown in FIG. 1, secondary electron reflection 20 dictates the brightness level of the acquired images. Sites with more reflected electrons as a result of higher secondary yield would appear brighter, whereas sites with electron returning paths would appear darker due to les secondary electrons available to the detector system 18. As a result, under static or an equilibrium condition, the level of brightness relates to the electron culmination and, therefore, to potential level at the site.

Figure 2A:
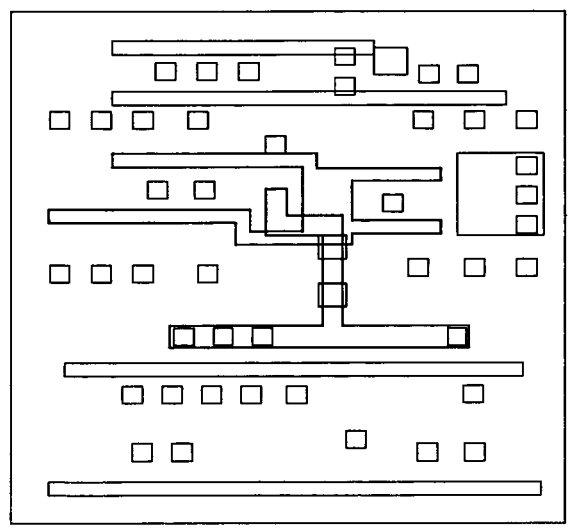
FIG. 2A provides an image of an example net cell.
Figure 2B:
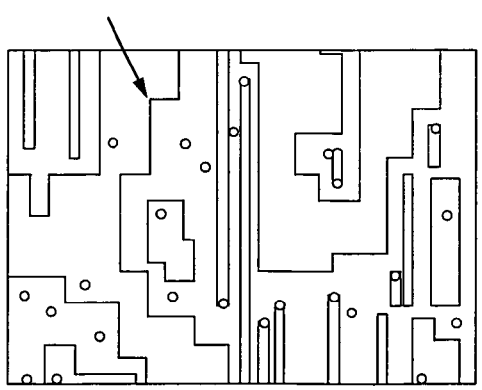
FIG. 2B provides a voltage contrast image of the FIG. 2A net cell, generated in accordance with the concepts of the present invention, for a malfunctioning circuit.
Figure 2C:
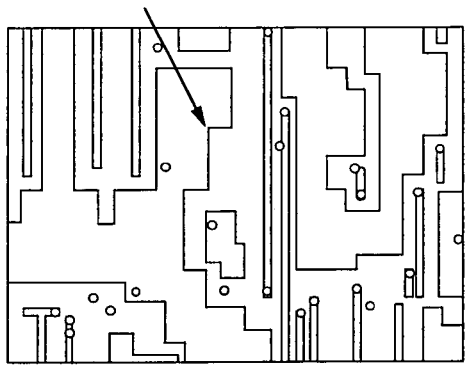
FIG. 2C provides a voltage contrast image of the FIG. 2A net cell, generated in accordance with the concepts of the present invention, for a functioning circuit.

Grayscale levels typically used in image capturing systems can quantify the level of brightness. An 8-bit system will have 256 levels of grayscale. In our application, we used the difference in grayscale level to identify faulty circuitry physically. As illustrated in FIGS. 2B and 2C, inspection and comparison of the same circuitry (FIG. 2A) between a "good" IC (FIG. 2B) and a bad IC (FIG. 2C) revealed differences in voltage contrast at the arrows. In this case, the reference image (FIG. 2A) is taken from another known good device at the same location under the same SEM inspection conditions.

FIGS. 3A–3F are collections of SEM micrographs showing an anomalous site. In this application, because of the regularity of the IC structures, any of the repeated array elements can be used as a reference.

Figure 3A:
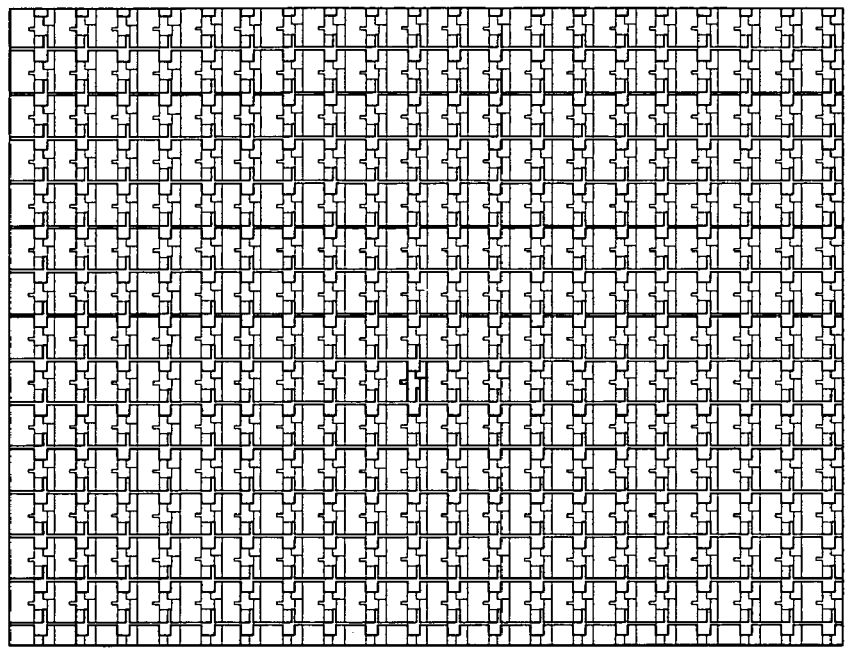
FIGS. 3A–3F are a collection of SEM micrographs showing an anomalous cite detected in accordance with the concepts of the present invention.
Figure 3B:
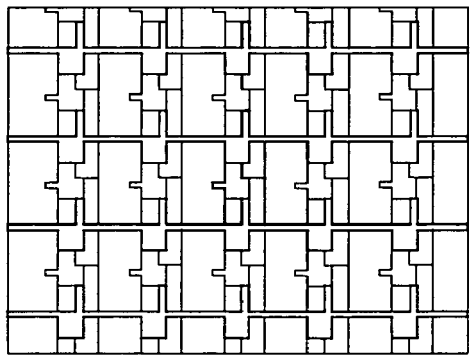
Figure 3C:
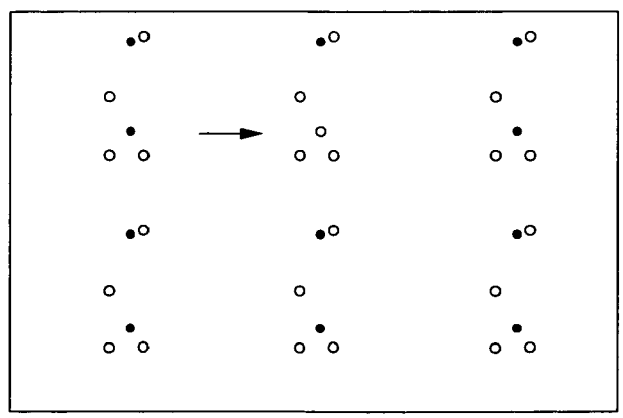
Figure 3D:
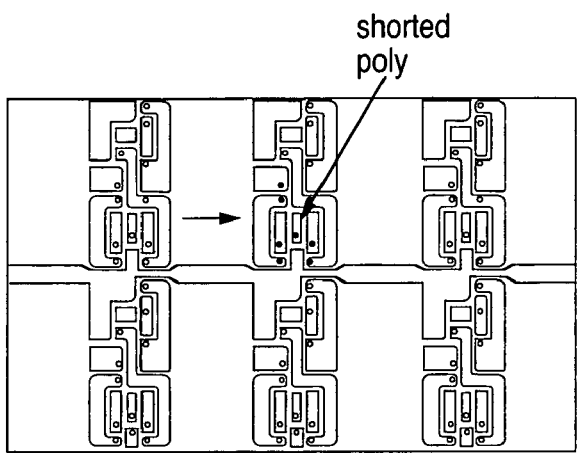
Figure 3E:
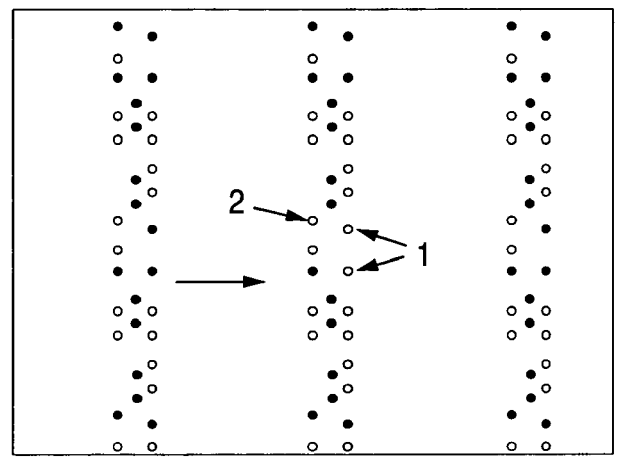
Figure 3F:
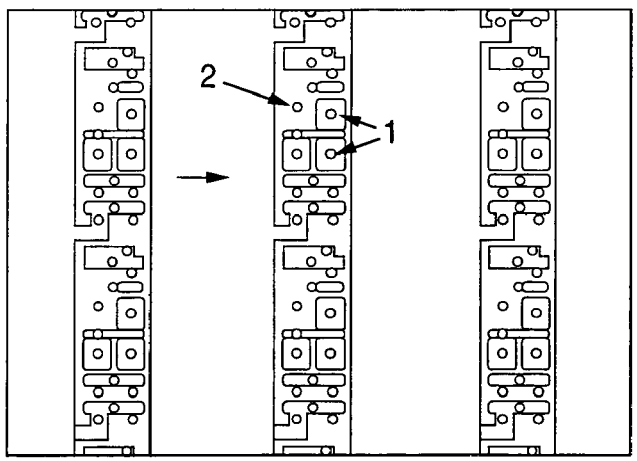

FIGS. 3A and 3B are examples taken at the M@ level showing the value of a contrast image library. In FIG. 3A, the anomalous site appears brighter than the references. FIG. 3B shows a close-up view of the contrast difference. Similar contrast comparisons are shown at various de-processing steps from FIGS. 3A through 3F. FIG. 3C is an example at the Vial level of the process. FIG. 3D is an example at the metal1 (M1) level of the process. FIG. 3E is an example at the poly level of the process. FIG. 3F is an example at the composite level of the process.

It is apparent from the above that referencing to voltage contrast levels of pre-characterized to known reference structures provides quick and effective localization of anomalies. As an illustration, the 8-bit grayscale levels at the anomalous and reference sites in SEM micrographs FIGS. 3B through 3F are shown in Table 1. The digitization of grayscale levels enables comparison in automated operation.

TABLE 1

| Figure | Brightness at anomaly | Reference Brightness |
|---|---|---|
| 3B | 254 | 120 |
| 3C at arrow | 248 | 80 |
| 3D shorted/reference poly | 188 | 75 |
| 3E at arrow 1 | 254 | 157 |
| 3E at narrow 2 | 118 | 99 |

Figure 4:
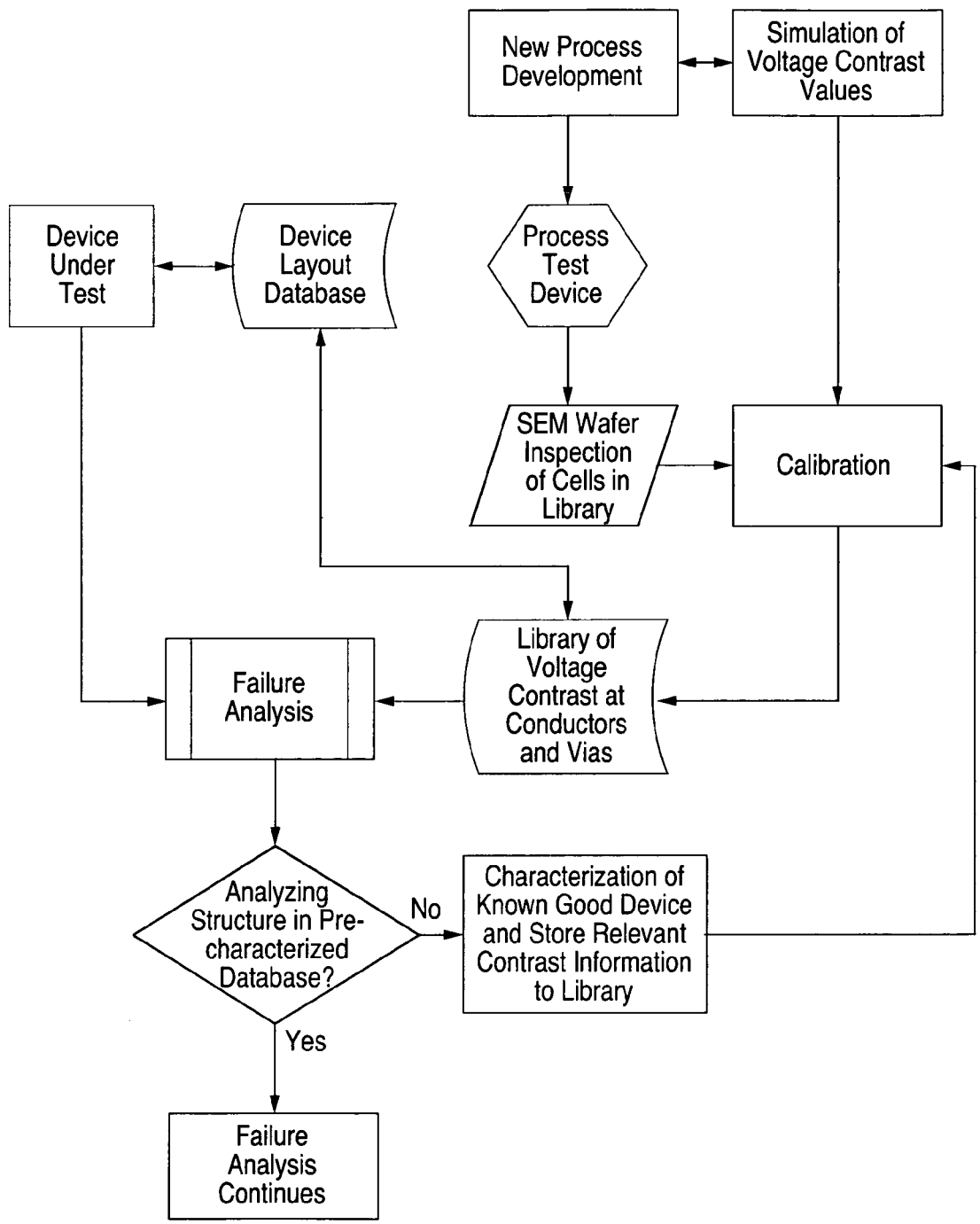
FIG. 4 is a flow chart showing an overview characterizing, calibrating and library building of voltage contrast values for circuit cell structures in accordance with the concepts of the present invention.

The FIG. 4 flow chart provides an overview of the method of characterizing, calibrating and library building of the associated voltage contrast values at appropriate cell structures. It also illustrates the application of actual device analysis, during which a device layout database is coupled for navigation. The stored contrast values can be retrieved during SEM analysis to check for discrepancy.

Although only specific embodiments of the present invention are shown and described herein, the invention is not to be limited by these embodiments. Rather, the scope of the invention is to be defined by these descriptions taken together with the attached claims and their equivalents.

What is claimed is:

1. A method of quantifying faults in an integrated circuit device under test, the method comprising:
   testing a plurality of individual circuit cells that have been determined to be normal to generate normal voltage contrast characteristics for each of the circuit cells;
   creating a reference library that includes the generated normal voltage contrast characteristics for each of the tested circuit cells;
   sequentially determining if circuit cells included in the integrated circuit device under test are included in the reference library;
   in the event that a circuit cell included in the integrated circuit device under test is included in the reference library, comparing the voltage contrast characteristics of said circuit cell with the corresponding normal voltage contrast characteristics include in the reference library; and
   in the event that said circuit cell is not included in the reference library, determining normal voltage contrast characteristics for said cell and including said normal voltage contrast characteristics in the reference library.

* * * * *